(12) United States Patent
Ohno et al.

(10) Patent No.: US 6,482,556 B1
(45) Date of Patent: Nov. 19, 2002

(54) THERMOSENSIBLE TRANSFER FILM AND METHOD OF USING THE SAME

(75) Inventors: Katsutoshi Ohno, Tokyo (JP); Koji Fujita, Kanagawa (JP); Teruhisa Shimada, Saitama (JP); Norio Yabe, Saitama (JP)

(73) Assignees: Sony Corporation (JP); Nippon Paper Industries Co., Ltd. (JP)

( * ) Notice: Subject to any disclaimer, the term of this patent is extended or adjusted under 35 U.S.C. 154(b) by 90 days.

(21) Appl. No.: 09/628,043

(22) Filed: Jul. 28, 2000

(30) Foreign Application Priority Data

Jul. 30, 1999 (JP) ............................................. 11-217347

(51) Int. Cl.$^7$ ............................................... H01S 9/227
(52) U.S. Cl. ...................... 430/27; 430/257; 430/258; 430/260; 430/24; 430/7
(58) Field of Search ........................... 430/7, 257, 258, 430/260, 27, 24

(56) References Cited

U.S. PATENT DOCUMENTS 5,645,963 A * 7/1997 Chang ........................... 430/7

FOREIGN PATENT DOCUMENTS

JP         9-147751 A  *  6/1997

* cited by examiner

*Primary Examiner*—John A. McPherson
(74) *Attorney, Agent, or Firm*—Rader, Fishman, & Grauer PLLC; Ronald P. Kananen, Esq.

(57) ABSTRACT

To provide a thermosensitive transfer film in which a color filter layer and a phosphor layer can be easily formed by a small number of processes and a method of using the film. A thermosensitive transfer film 10 comprising at least a photosensitive phosphor layer 5 of a predetermined color, a color filter layer 4 of the same color, and a photosensitive adhesive layer 3 which are provided on a base film 6.

2 Claims, 6 Drawing Sheets

12

14

THERMOSENSIBLE TRANSFER FILM AND METHOD OF USING THE SAME

BACKGROUND OF THE INVENTION

1. Field of the Invention

The present invention relates to a thermosensitive transfer film used to form a phosphor screen in a display, such as a color cathode ray tube or the like, and to a method of using the film.

2. Description of the Related Art

In recent years, as the color cathode ray tube is becoming larger and its screen is becoming flatter, there is an increased demand for enhanced contrast and color purity in the quality aspect and the like.

Consequently, various constructions to enhance the contrast have been proposed.

FIG. 6 is a schematic diagram showing phosphors of three colors formed on a panel glass of a color cathode ray tube.

On a panel 50, phosphor layers 51B, 51G and 51R, corresponding to the three colors blue, green and red, respectively, are disposed, and a light absorbing layer 52 made of carbon is formed between the phosphor layers 51B, 51G and 51R.

In FIG. 6, the transmittance of the panel 50 is set as T, and intensities of light emitted to the phosphor layers 51B, 51G and 51R are set as $L_B$, $L_G$ and $L_R$, respectively.

With attention to the center phosphor layer 51G of green, when the reflectance of external light having an intensity of $L_O$ applied to the green phosphor layer 51G is $R_G$, the intensity (corresponding to luminance) of transmission light $L_1$ is expressed as LG×T, and the intensity of reflection light $L_2$ of the external light is expressed as $L_O \times T \times R_G \times T$. Similar expressions apply for the other phosphor layers 51B and 51R.

In this case, the contrast can be expressed as follows.
Contrast

=intensity of transmission light $L_1$/intensity of reflection light $L_2$ of external light

=LG×T/$L_O$×TR$_G$×T=$L_G/L_O$×$R_G$×T

From the equation, it is understood that, in order to enhance the contrast, first, the transmittance T of the panel 50 has to be reduced.

For example, the method of enhancing the contrast by coloring the panel glass to reduce the reflection of external light has been considered. A color cathode ray tube of a high contrast using a dark glass and having a transmittance T of 40 to 50% as the panel glass has been commercially available.

The method of enhancing the contrast by using the dark glass is, however, equivalent to form, so to speak, a black filter. It is not preferable, since light emission of the phosphor is absorbed by the panel glass and the luminance deteriorates.

In addition; the method of enhancing the contrast by adhering a pigment of the same color as that of the phosphor to the surface of a phosphor particle has been proposed. By this method as well, since light emitted by the phosphor is absorbed by the pigment of the same color, the luminance deteriorates.

Methods of providing a color filter of the same color as that of the light emitted by the phosphor between the panel glass and the phosphor layer have been proposed (refer to Japanese Unexamined Patent Application Nos. 64-7457, 5-275006, 5-266795, 9-274103 and the like).

Specifically, as shown in FIG. 7, color filter layers 53B, 53G and 53R, having the same colors as those of the phosphor layers 51B, 51G and 51R, are formed under the phosphor layers 51B, 51G and 51R, respectively.

By forming the color filter layers 53B, 53G and 53R, the transmittance is obtained from the transmittance T of the panel glass 50 and the transmittances from each of the color filter layers 53B, 53G and 53R, so that the resultant transmittance is slightly lowered.

In this case, although the luminance also is slightly lowered, the reflectance RG is lowered more than that by the color filter layers 53B, 53G and 53R. The intensity of the reflection light $L_2$ is, therefore, suppressed and the contrast ratio can be improved.

By this method, therefore, both color purity and contrast can be largely improved.

When compensating for the reduction in the luminance due to the formation of the color filter layers 53B, 53G and 53R, the intensities of the electron beams $L_B$, $L_G$ and $L_R$ are raised.

SUMMARY OF THE INVENTION

In the case of providing the color filter layers, it is necessary to perform the process of forming the color filter layers by a slurry method and, after that, the process of forming phosphor layers on the color filter layers by using the slurry method.

The slurry method is a method comprising the steps of preparing a slurry in which a material of either a color filter layer or a phosphor layer and a photosensitive component are dispersed, applying the slurry, drying the slurry to form a layer, and patterning the layer by exposure and development, thereby forming a color filter layer or a phosphor layer in a predetermined pattern.

In the case of forming a red color filter layer, since ferric oxide (transparent red oxide) and cadmium sulfoselenide used as red pigments absorb ultraviolet rays at the time of exposure, the red color filter layer is not sufficiently set in the thickness direction, and the pattern loses its shape by the development. The red color filter layer, therefore, cannot be patterned by the slurry method.

The red color filter layer has to be formed by using the so-called inversion development.

Specifically, after a resist layer is formed on the whole surface, the resist layer is patterned by exposure and development so that the parts (blue pixels, green pixels and carbon strips between them), expect for red pixels remain.

On the whole surface, a slurry containing the material of the red color filter is applied and dried.

After that, both the resist layer and the material of the red color filter on the resist layer are lifted off. Consequently, the red color filter layer can be formed only in areas of the red pixels where there is no resist layer.

As described above, in order to mount the color filter to the color cathode ray tube, in addition to the manufacturing processes of the color cathode ray tube on which no color filter is mounted, a large number of processes are necessary. Consequently, there are the drawbacks that the work is very complicated and the manufacturing cost is high.

Moreover, in the manufacturing process, the processes of slurry application, drying, exposure, development and drying of a pattern are added. Since this increases the burden on the carbon strips 52 that are already formed before the color filters are formed, the linearity of the edges of the pixels obtained deteriorates, a defect occurs due to a break, and a defect due to adhered dust or trapped foreign matter also occurs.

When polyvinylalcohol (PVA) - ammonium dichromate (ADC), polyvinylalcohol (PVA) - sodium dichromate (SDC) or the like as a photosensitive component is used for a slurry for a color filter, a large amount of drainage containing chrome is generated in the manufacturing process. This causes the problem of a high cost for drainage disposal.

To deal with the problems, the invention provides a thermosensitive transfer film of which the color filter layer and the phosphor layer can be formed easily with a small number of processes, a method of using the film, a method of manufacturing a display, and a method of manufacturing a cathode ray tube.

DESCRIPTION OF THE PREFERRED EMBODIMENTS

Figure 1:
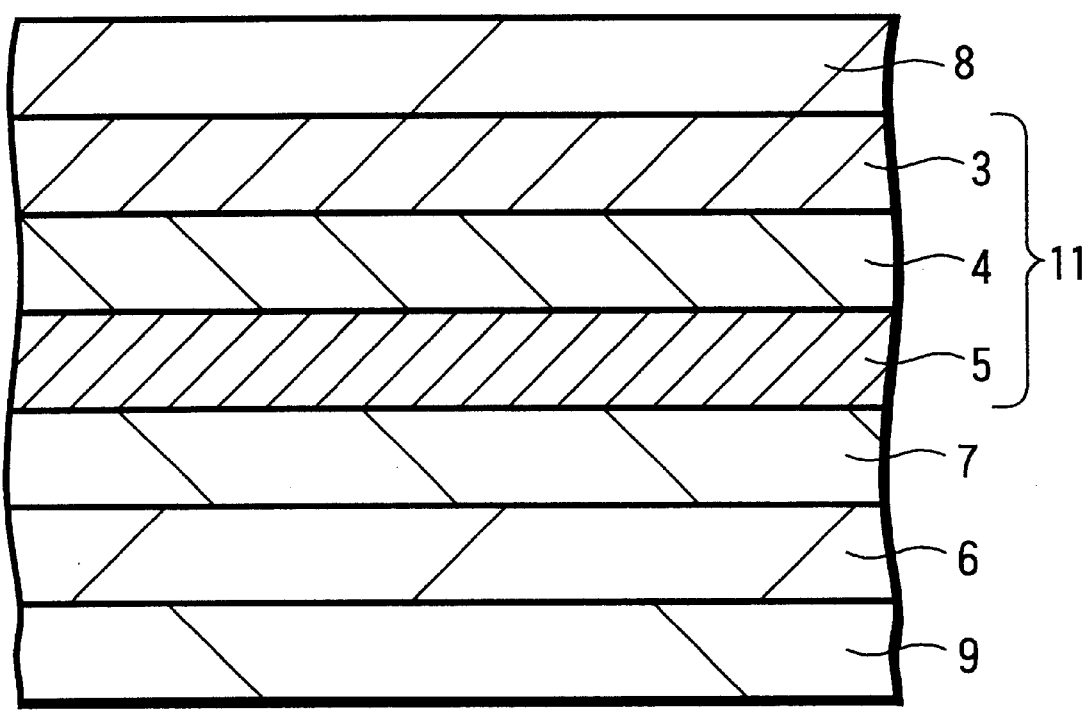
FIG. 1 is a schematic construction diagram (cross section) of a thermosensitive transfer film according to an embodiment of the invention.

A thermosensitive transfer film of the invention comprises at least a photosensitive phosphor layer of a predetermined color, a color filter layer of the same color, and a photosensitive adhesive layer, which are provided on a base film.

According to the construction of the thermosensitive transfer film of the invention, by comprising at least a photosensitive phosphor layer of a predetermined color, a color filter layer of the same color, and a photosensitive adhesive layer, the phosphor layer and the color filter layer can be simultaneously transferred by thermal transfer. Thus, the phosphor layer and the color filter layer can be easily formed.

By comprising the photosensitive phosphor layer and the phosphor adhesive layer, after the transfer, patterning can be easily made by exposure.

According to a method of using a thermosensitive transfer film of the invention, transfer is performed while applying heat and pressure by a transfer roller on a thermosensitive transfer film comprising at least a photosensitive phosphor layer of a predetermined color, a color filter layer of the same color, and a photosensitive adhesive layer, which are provided on a base film.

According to the method of the invention, by performing a transfer while applying heat and pressure by a transfer roller, the phosphor layer and the color filter layer are simultaneously transferred. Consequently, the phosphor layer and the color filter layer can be formed easily.

A thermosensitive transfer film of the invention comprises at least a photosensitive phosphor layer of a predetermined color and a photosensitive adhesive layer, which are provided on a base film.

According to the construction of the thermosensitive transfer film of the invention, by comprising at least the photosensitive phosphor layer of a predetermined color and the photosensitive adhesive layer, the phosphor layer is transferred by thermal transfer. Therefore, the phosphor layer can be easily formed.

Since the film comprises the photosensitive phosphor layer and the photosensitive adhesive layer, by performing exposure after the transfer, patterning can be easily made.

A thermosensitive transfer film of the invention comprises at least a color filter layer of a predetermined color and a photosensitive adhesive layer.

According to the construction of the thermosensitive transfer film of the invention, by comprising at least the color filter layer of a predetermined color and the photosensitive adhesive layer, the color filter layer is transferred by thermal transfer. Therefore, the color filter layer can be easily formed.

Since the film comprises the photosensitive adhesive layer, by performing exposure after the transfer, patterning can be easily made.

According to a method of using a thermosensitive transfer film of the invention, a transfer is performed while applying heat and pressure by a transfer roller on a thermosensitive transfer film comprising at least a photosensitive phosphor layer of a predetermined color and a photosensitive adhesive layer, which are provided on a base film.

According to the method of the invention, by performing a transfer while applying heat and pressure by a transfer roller, the phosphor layer is transferred. Consequently, the phosphor layer can be easily formed.

According to a method of using a thermosensitive transfer film of the invention, a transfer is performed while applying heat and pressure by a transfer roller on a thermosensitive transfer film comprising at least a color filter layer of a predetermined color and a photosensitive adhesive layer, which are provided on a base film.

According to the method of the invention, by performing a transfer while applying heat and pressure by a transfer roller, the color filter layer is transferred. Thus, the color filter layer can be easily formed.

The invention relates to a thermosensitive transfer film comprising at least a photosensitive phosphor layer of a predetermined color, a color filter layer of the same color, and a photosensitive adhesive layer, which are provided on a base film.

The invention relates to a method of using a thermosensitive transfer film comprising a photosensitive phosphor layer of a predetermined color, a color filter layer of the same color, and a photosensitive adhesive layer, which are provided on a base film, characterized in that a transfer is performed while applying heat and pressure by a transfer roller on the film.

The invention relates to a thermosensitive transfer film comprising at least a photosensitive phosphor layer of a predetermined color and a photosensitive adhesive layer, which are provided on a base film.

The invention relates to a thermosensitive transfer film comprising at least a color filter layer of a predetermined color and a photosensitive adhesive layer, which are provided on a base film.

The invention relates to a method of using a thermosensitive transfer film comprising a photosensitive phosphor layer of a predetermined color and a photosensitive adhesive layer, which are provided on a base film, characterized in that a transfer is performed while applying heat and pressure by a transfer roller.

The invention relates to a method of using a thermosensitive transfer film comprising: a color filter layer of a predetermined color; and a photosensitive adhesive layer, which are provided on a base film, characterized in that a transfer is performed while applying heat and pressure by a transfer roller.

FIG. 1 is a schematic construction diagram (cross section) of a thermosensitive transfer film as an embodiment of the invention.

A thermosensitive transfer film 10 is constructed in such a manner that, on a base film 6 as a supporting body, for example, a cushion layer 7 made of a thermoplastic resin, a photosensitive phosphor layer 5, a color filter layer 4 and a photosensitive adhesive layer 3 are sequentially deposited and a cover film 8 is formed on the surface in order to protect the photosensitive adhesive layer 3.

In order to prevent the occurrence of an electrostatic charge at the time of peeling, an antistatic layer 9 is formed on the back face of the base film 6.

At the time of use, first, the cover film 8 is peeled off, and the transfer operation is performed while applying heat and pressure by a transfer roller to peel off the base film 6 and the cushion layer 7.

That is, three layers, i.e., the photosensitive phosphor layer 5, the color filter layer 4 and the photosensitive adhesive layer 3 become a portion 11, which remains finally.

For example, the base film 6 has a thickness of about 75 $\mu$m, the cushion layer 7 has a thickness of about 40 $\mu$m, the photosensitive phosphor layer 5 has a thickness of about 10 $\mu$m, the color filter layer 4 has a thickness of about 3 $\mu$m, the photosensitive adhesive layer 3 has a thickness of about 1 $\mu$m, and the cover film 8 has a thickness of about 50 $\mu$m.

The photosensitive adhesive layer 3 contains a photosensitive material which is set by being irradiated with ultraviolet rays.

Since it is photosensitive, the adhesive layer 3 can be patterned by exposure and development.

The color filter layer 4 contains a material of a color filter of a predetermined color, such as a coloring pigment, and a photosensitive or non-photosensitive water-soluble resin.

In the case of using the non-photosensitive water-soluble resin, when the photosensitive adhesive layer 3 and the photosensitive phosphor layer 5 as upper and lower layers are patterned, the color filter layer 4 is patterned at the same time.

For the red color filter layer 4, a material which does not transmit (or absorb) ultraviolet rays, such as ferric oxide, Cd (S, Se) or the like, is used as a coloring pigment.

The photosensitive phosphor layer 5 is made of a phosphor material which emits light of a predetermined color and a photosensitive material.

Preferably, a photosensitive agent such as SBQ (denatured polyvinyl alcohol to which a photosensitive group such as stilbazolium group is added) or a diazo photosensitive agent is used as the photosensitive material.

Since those photosensitive agents do not contain chrome, no drainage containing chrome is generated at the time of development.

In the case of using thermosensitive transfer films 10 in correspondence with a plurality of colors, thermosensitive transfer films 10 each having a stack structure similar to that shown in FIG. 1 are prepared for respective colors.

By using the thermosensitive transfer films 10 of the embodiment for a display, such as color cathode ray tube or plasma display, a display in which pixels of respective colors are constructed by laminating the phosphor layer and the color filter layer can be formed.

A method of manufacturing a color cathode ray tube having a phosphor screen in which the color filter layer is formed by using the thermosensitive transfer films 10 shown in FIG. 1 will now be described.

A case of forming color filter layers of three colors by using the thermosensitive transfer films 10 corresponding to the three colors of blue, green and red will be described here.

First, a light absorbing layer 2 in strips or dots of black is formed on the inner face of a panel glass 1 by a conventionally known method.

Figure 2A:
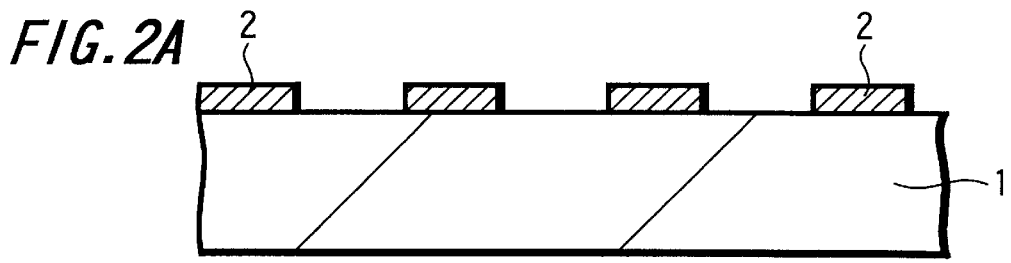
FIGS. 2A to 2D are process drawings for explaining the manufacturing processes of a color cathode ray tube using the thermosensitive transfer film of FIG. 1.

Specifically, a resist is applied on the inner face of the panel glass 1 and is dried. After that, the resist is exposed via color screening electrodes such as a shadow mask used for the color cathode ray tube, developed with warm water at, for example, 20° to 25° C., and dried, thereby forming a transparent resist layer in a position corresponding to each of blue, green and red. A carbon slurry is applied on the resist layer and is dried, thereby adhering a carbon layer. After that, by washing with hydrogen peroxide water, the resist layer and the carbon layer thereon are completely removed (inversion development). In such a manner, the light absorbing layer 2 in a predetermined pattern is formed (refer to FIG. 2A).

Figure 2B:
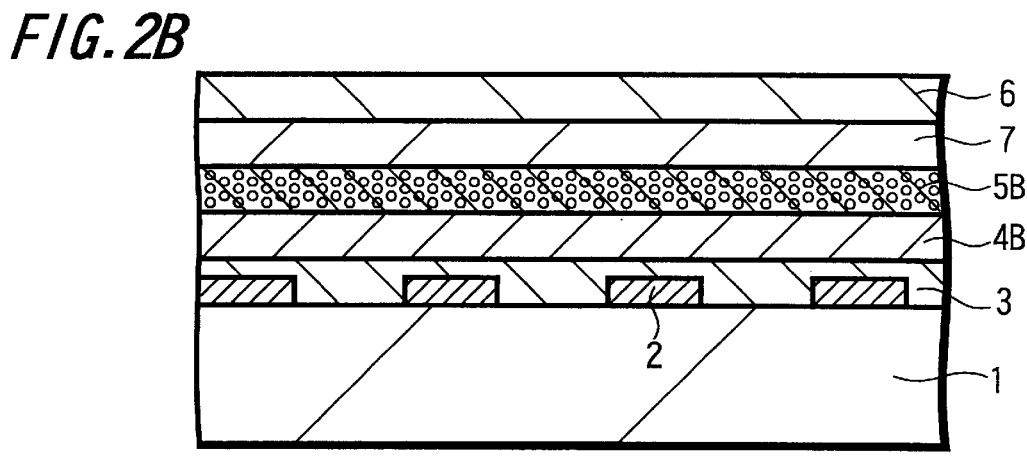

Subsequently, the cover film 8 in the transfer film 10 for forming blue pixels is peeled off. As shown in FIG. 2B, the adhesive layer 3 and the light absorbing layer 2 are overlapped and are heated and pressurized by a transfer roller so as to be laminated. As the conditions of laminating, for example, the temperature is 120° C. and the pressure is 1.3 kg/cm².

The cushion layer 7 and the phosphor layer 5B are separated from each other to peel off the base film 6 and the cushion layer 7.

Figure 2C:
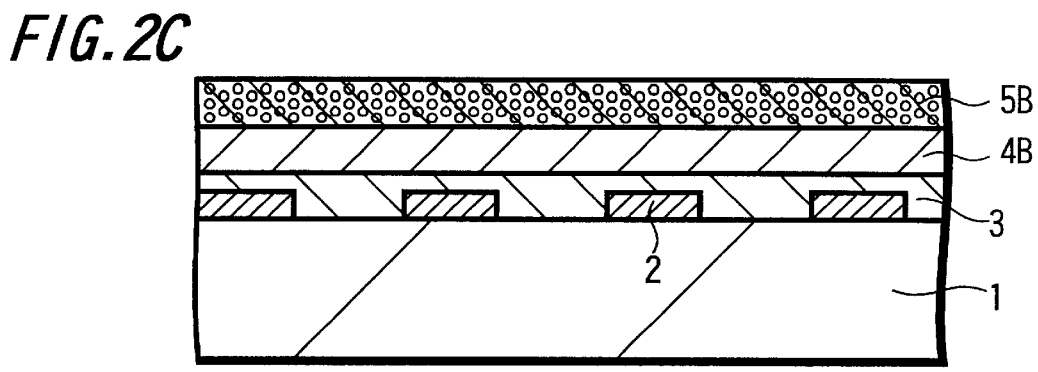

Consequently, as shown in FIG. 2C, a blue color filter layer 4B and a blue phosphor layer 5B are formed on the light absorbing layer 2 via the adhesive layer 3.

Figure 2D:
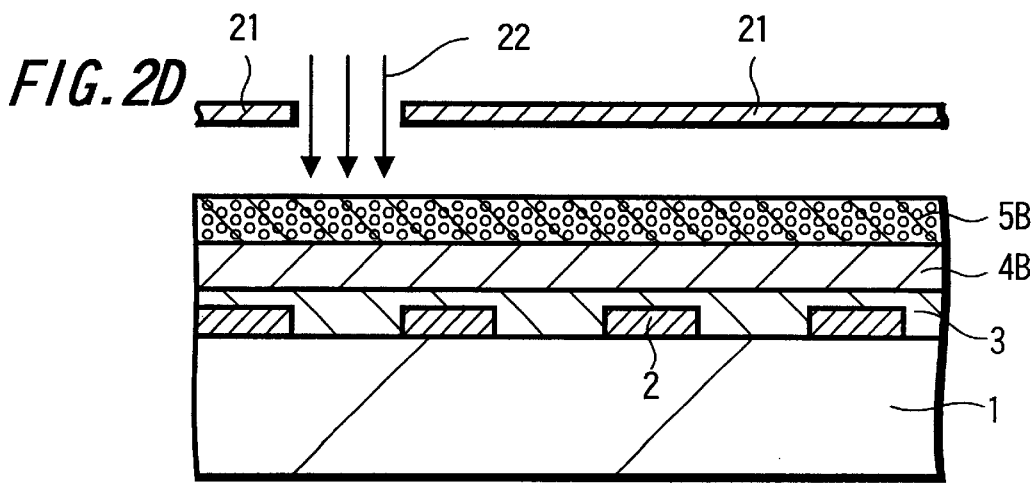

Then, as shown in FIG. 2D, a blue pixel part is exposed from the inner side (inner face side) of the panel glass 1 via the color screening electrodes, such as the shadow mask 21 used for the cathode ray tube.

Figure 3A:
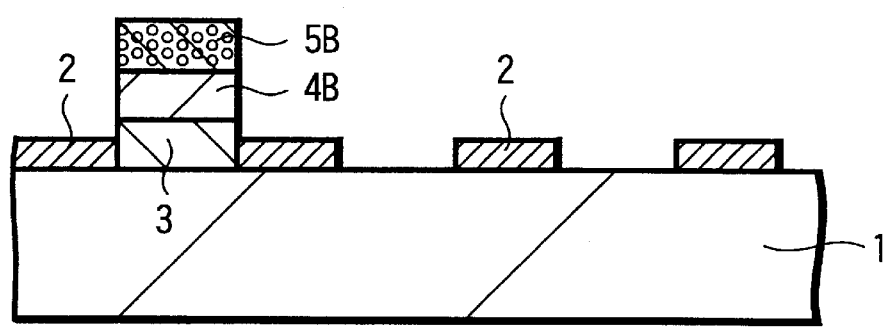
FIGS. 3A to 3C are process drawings for explaining the manufacturing processes of the color cathode ray tube using the thermosensitive transfer film of FIG. 1.

After that, the unexposed part is completely removed by development with warm water at, for example, 20 to 25° C., and is dried, thereby forming a blue pixel consisting of the blue color filter layer 4B and the blue phosphor layer 5B, as shown in FIG. 3A.

Also in the case of forming the next green pixel, the thermosensitive transfer film 10 for forming a green pixel is similarly laminated on the blue pixel by being heated and pressurized by a transfer roller. The base film 6 and the cushion layer 7 are peeled off and a green color filter layer 4G and a green phosphor layer 5G are transferred via the adhesive layer 3.

Figure 3B:
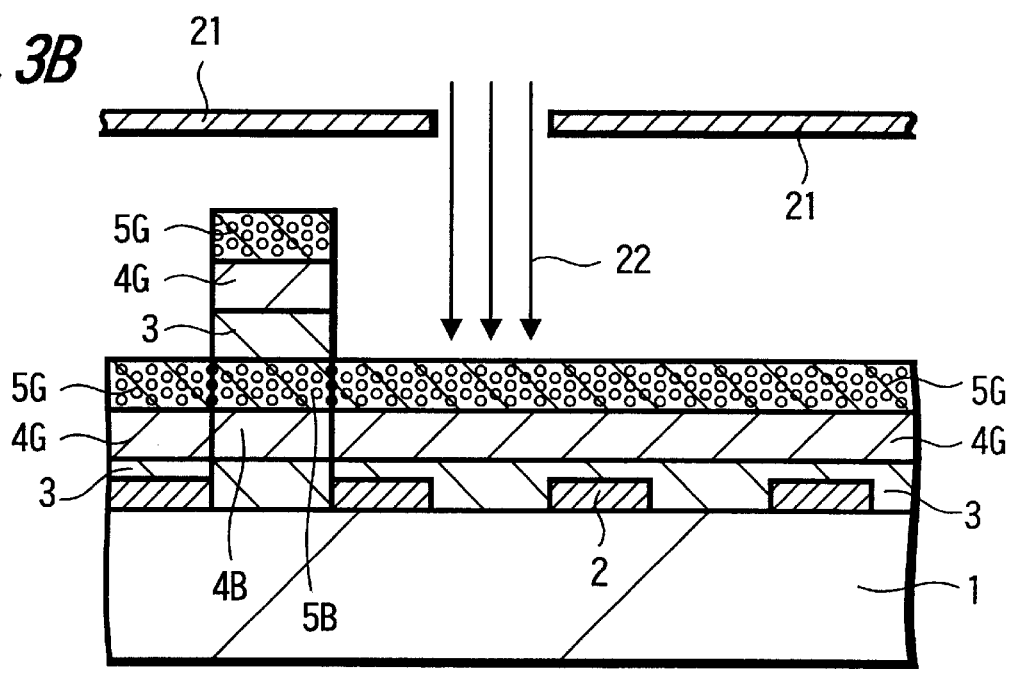

As shown in FIG. 3B, a green pixel part is exposed via the shadow mask 21 from the inside of the panel glass 1.

Figure 3C:
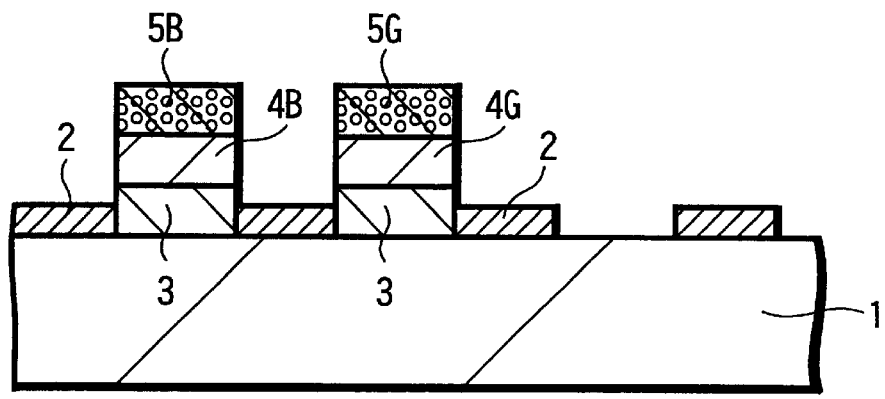

After that, the unexposed part is completely removed by development with warm water at, for example, 20 to 25° C., and the resultant is dried. As shown in FIG. 3C, a green pixel consisting of the green color filter layer 4G and the green phosphor layer 5G is formed.

Finally, a red pixel is formed. In a manner similar to the blue and green pixels, first, the thermosensitive transfer film 10 for forming a red pixel is laminated on the blue and green pixels by being heated and pressurized by a transfer roller. The base film 6 and the cushion layer 7 are peeled off and a red color filter 4R and a red phosphor layer 5R are transferred via the adhesive layer 3.

Figure 4A:
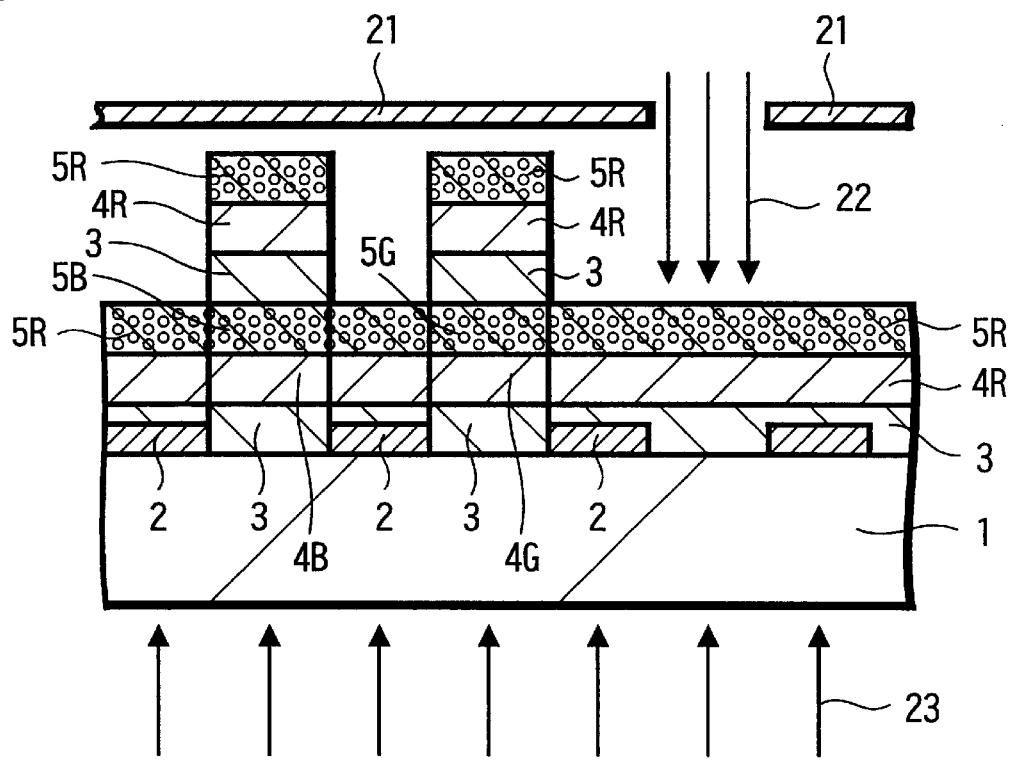
FIGS. 4A and 4B are process drawings for explaining the manufacturing processes of the color cathode ray tube using the thermosensitive transfer film of FIG. 1.

Since the red color filter layer 4R absorbs light used for exposure, as described above, the exposure in this case is performed, as shown in FIG. 4A, by both internal exposure 22 from the inside of the panel glass 1 to the red pixel part via the shadow mask 21 and external exposure 23 to the whole face from the outside of the panel glass 1.

At this time, since light from the external exposure 23 is absorbed by the blue and green pixels via the adhesive layer 3, the color filter layers 4B and 4G and the phosphor layers 5B and 5G, the adhesive layer 3 thereon is exposed little so that it is not set. In the light absorbing layer 2, light of the external exposure 23 is interrupted.

In the adhesive layer 3 and the color filter layer 4R, therefore, only the red pixel part is exposed by the external exposure 23 and is set.

The red phosphor layer 5R in the red pixel part is set by the internal exposure 22.

Figure 4B:
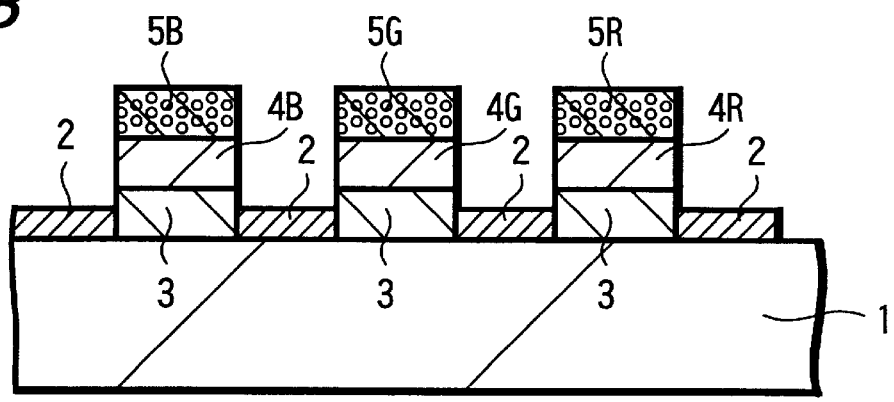

The resultant is developed with warm water at, for example, 20 to 25° C., and the unexposed parts on the blue and green pixels and the light absorbing layer 2 are completely removed. After that, the resultant is dried. As shown in FIG. 4B, a red pixel consisting of the red color filter layer 4R and the red phosphor layer 5R is formed.

On the phosphor screen formed by the blue, green and red pixels fabricated by the thermosensitive transfer films 10, an acrylic resin is applied as an intermediate layer to make the surface of the phosphor pixels smooth. Then, a metal backing layer is formed by depositing aluminum or the like.

After that, the panel glass 1 and a funnel glass are themolaminated. In such a manner, the color cathode ray tube can be formed. In the thermolaminating process, organic matters are completely burnt.

In the color cathode ray tube in which the color filter layers 4 (4B, 4G and 4R) are formed as mentioned above, external light is absorbed by the color filer layers 4 (4B, 4G and 4R), so that the reflection light is weakened. Consequently, the contrast is enhanced.

By using a glass having a high transmittance T as the panel glass 1, the luminance can be enhanced.

Thus, a color image of high contrast and high color purity can be obtained.

By using the thermosensitive transfer films 10 in such a manner, the color filter layer 4 and the phosphor layer 5 can be formed only by the processes of transfer, exposure, development and drying. The manufacturing process can be largely simplified as compared with the conventional slurry method.

As compared with the conventional slurry method, the burden on the light absorbing layer 2 is lessened by decreasing the number of processes, so that the occurrence of a defect in the light absorbing layer 2 can be reduced.

The color filter layer 4 and the phosphor layer 5 obtained by the manufacturing method have high pattern accuracy, and the occurrence of a defect in them is remarkably reduced.

Further, the possibility of trapping of dust and foreign matter is also reduced, so that the occurrence of a defect caused by them is accordingly suppressed.

By using the photosensitive material which does not contain chrome as the photosensitive component used for the thermosensitive transfer film 10, there is the advantage that no drainage containing a chrome substance, which is conventionally a problem, is generated in the fabrication of the blue, green and red pixels.

By using the thermosensitive transfer film 10, restrictions such as viscosity, dispersibility and application properties in the color filter layer 4 and the phosphor layer 5 are relaxed, as compared with the conventional slurry method. Consequently, there also is the advantage that photosensitive material which does not contain chrome is easy.

Subsequently, another embodiment of the invention will now be described.

In the embodiment, a color filter layer and a phosphor layer of the same color are formed by separate thermosensitive transfer films.

FIG. 5 is a schematic construction diagram (cross section) of two kinds of thermosensitive transfer films used in the embodiment.

Figure 5A:
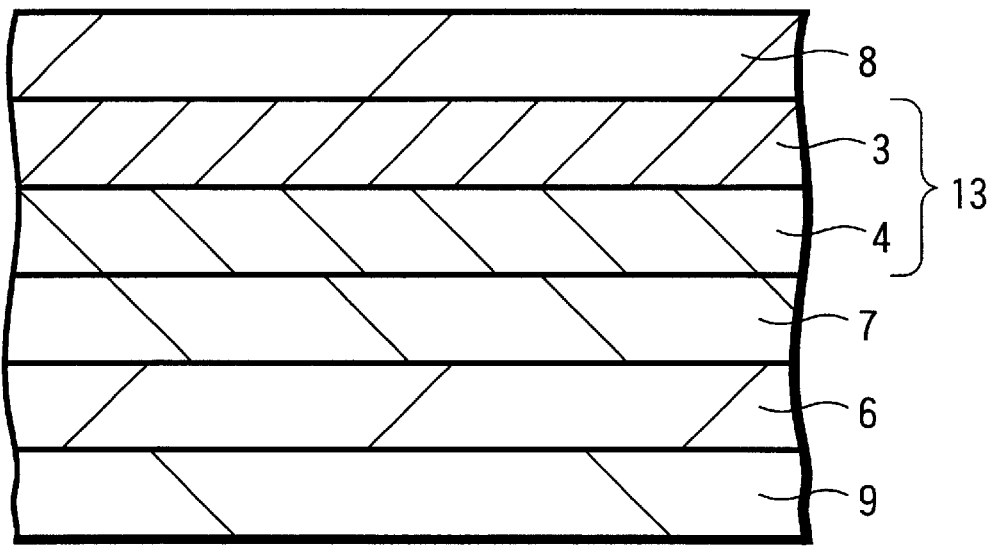
FIGS. 5A and 5B are schematic construction diagrams (cross sections) of a thermosensitive transfer film of another embodiment of the invention.

The first thermosensitive transfer film 12 shown in FIG. 5A has the photosensitive adhesive layer 3 and the color filter layer 4 as a part 13, which remains finally, and the other construction is similar to that of the thermosensitive transfer film 10 of FIG. 1.

Figure 5B:
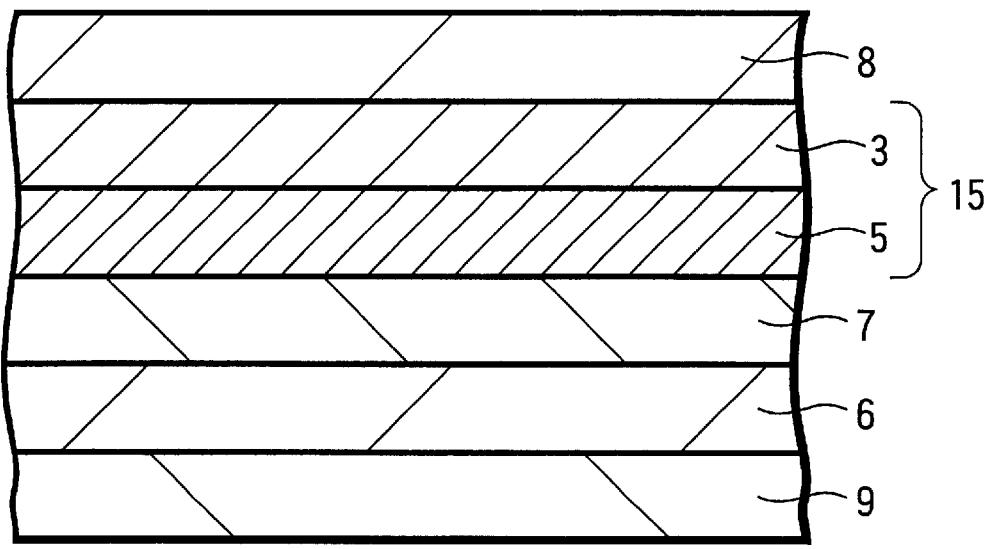
Figure 6:
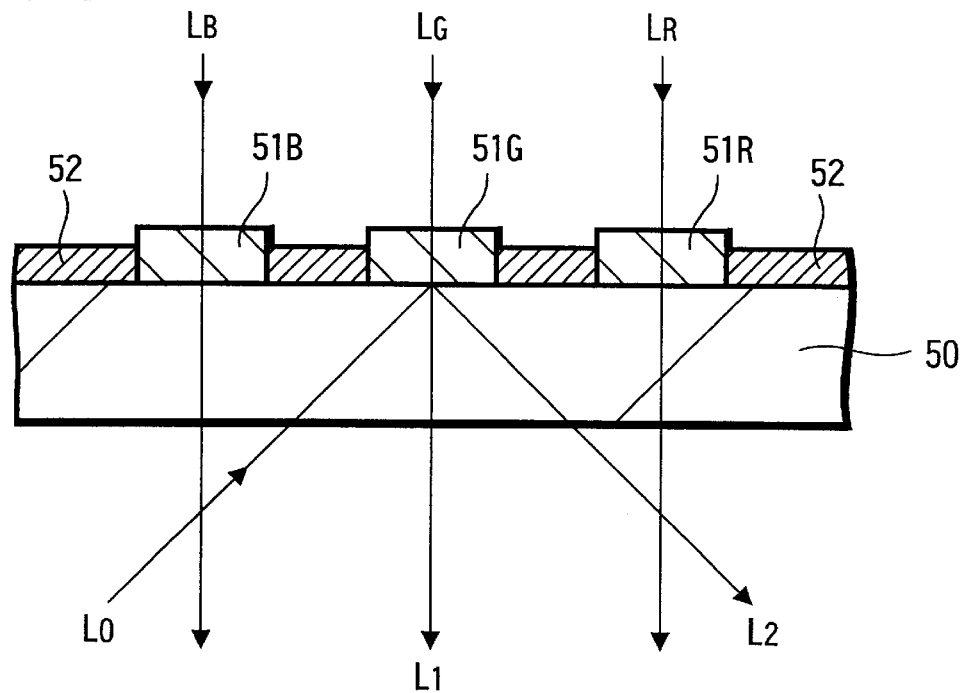
FIG. 6 is a cross section of a phosphor screen for a conventional color cathode ray tube.
Figure 7:
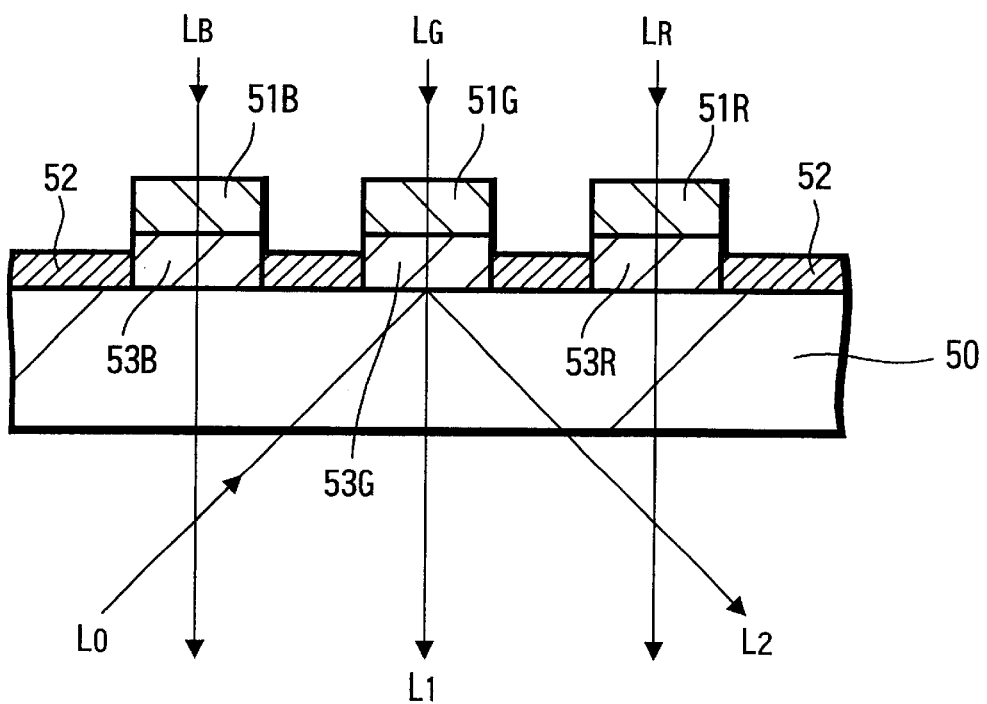
FIG. 7 is a diagram for explaining a phosphor screen for a color cathode ray tube whose contrast is enhanced by forming a color filter.

A second thermosensitive transfer film 14 shown in FIG. 5B has the photosensitive adhesive layer 3 and the photosensitive phosphor layer 5 as a part 15, which remains finally, and the other construction is similar to that of the thermosensitive transfer film 10 of FIG. 1.

In the embodiment, in a manner similar to the thermosensitive transfer film 10 of the foregoing embodiment, a transfer is performed by laminating while applying heat and pressure.

The color filter layer 4 is transferred from the first thermosensitive transfer film 12 via the adhesive layer 3. Onto the color filter layer 4, the phosphor layer 5 is transferred from the second thermosensitive transfer film 14 via the adhesive layer 3.

Although the color filter layer 4 is formed for all of the blue, green and red pixels in the foregoing embodiment, the color filter layer may be formed only for a part of the colors. Specifically, for example, a construction such that a green pixel is made by the green phosphor layer and red and blue pixels are formed by a stack structure of the color filter layer and the phosphor layer also may be used.

In this case, by using the thermosensitive transfer films 12 and 14 of the embodiment, the green pixel can be formed by transferring the green phosphor layer 5 from the second thermosensitive transfer film 14 having the green phosphor layer 5, and the blue and red pixels can be formed by transferring the color filter layer 4 and the phosphor layer 5 from the first thermosensitive transfer film 12 having the color filter layer 4 and the second thermosensitive transfer film 14 having the phosphor layer 5.

When there are a pixel in a color formed by using the color filter layer 4 and a pixel in a color formed without using the color filter layer 4, the thermosensitive transfer film 10 of FIG. 1 and the thermosensitive transfer films 12 and 14 of the embodiment may be properly used according to the colors.

By selectively using the three kinds of thermosensitive transfer films of blue, green and red in accordance with the construction of the color cathode ray tube, the invention can easily deal with a color cathode ray tube of a construction using color filters of two colors and of a construction in which the color filter of a single color is formed on the phosphor screen.

Although the case of forming the blue, green and red pixels by using the shadow mask 21 as color screening electrodes has been described in the above embodiment, the invention can be similarly applied to a color cathode ray tube using color screening electrodes of other constructions.

For example, the invention also can be applied to a color cathode ray tube in which blue, green and red strips are formed by using slit-shaped color screening electrodes, that is, an aperture grille, a color cathode ray tube using color screening electrodes each having a rectangular slot shape, and the like.

The invention also can be similarly applied to a display, except for the cathode ray tube, such as PDP (Plasma Display Panel), LCD (Liquid Crystal Display), or FED (Field Emission Display).

In such a display, a color filter layer and a phosphor layer which form, for example, a pattern and a pixel of each color can be transferred from a thermosensitive transfer film.

In such a display, by performing exposure via a mask means adapted to a pattern of a predetermined color in place of the color screening electrodes, the transferred photosensitive adhesive layer 3, color filter layer 4 and phosphor layer 5 can be patterned.

For example, in a display having no phosphor layer but having only the color filter layer, a color filter layer can be formed by using the first thermosensitive transfer film 12 shown in FIG. 5A.

The invention is not limited to the foregoing embodiments but can be variously modified without departing from the gist of the invention.

According to the above-described invention, as compared with the method of forming a color filter layer by the conventional slurry method, the manufacturing process can be simplified. Consequently, the manufacturing cost can be reduced.

The patterns of the color filter layer and the phosphor layer can be formed with high precision, so that a very reliable color cathode ray tube can be manufactured.

Since a photosensitive material which does not contain chrome can be used as a photosensitive material of the thermosensitive transfer film, the discharge of a chrome substance can be prevented in the processes of forming the color filter layer and the phosphor layer.

Having described preferred embodiments of the present invention with reference to the accompanying drawings, it should be understood that the present invention is not limited to the above-mentioned embodiments and various changes and modifications can be effected therein by one skilled in the art without departing from the spirit or scope of the present invention, as defined in the appended claims.

What is claimed is:

1. A thermosensitive transfer film characterized by comprising:

a photosensitive phosphor layer of a predetermined color;

a color filter layer of the same color; and a photosensitive adhesive layer, which are provided on a base film.

2. A method of using a thermosensitive transfer film comprising: a photosensitive phosphor layer of a predetermined color; a color filter layer of the same color; and a photosensitive adhesive layer, which are provided on a base film, wherein a transfer is performed while applying heat and pressure by a transfer roller.

\* \* \* \* \*